US008390374B2

(12) United States Patent
Alexander et al.

(10) Patent No.: US 8,390,374 B2
(45) Date of Patent: Mar. 5, 2013

(54) APPARATUS AND METHOD FOR AMPLIFICATION WITH HIGH FRONT-END GAIN IN THE PRESENCE OF LARGE DC OFFSETS

(75) Inventors: Alasdair Gordon Alexander, Andover, MA (US); David James Plourde, Dracut, MA (US); Matthew Nathan Duff, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 29 days.

(21) Appl. No.: 13/013,666

(22) Filed: Jan. 25, 2011

(65) Prior Publication Data

US 2012/0188009 A1    Jul. 26, 2012

(51) Int. Cl.
*H03F 3/45* (2006.01)
(52) U.S. Cl. .............................. 330/69; 330/85; 330/147
(58) Field of Classification Search .................... 330/69, 330/85, 147
See application file for complete search history.

(56) References Cited

U.S. PATENT DOCUMENTS

| | | | | |
|---|---|---|---|---|
| 3,908,173 | A * | 9/1975 | Murdock | 330/253 |
| 4,260,954 | A * | 4/1981 | Crooks | 330/85 |
| 4,638,258 | A * | 1/1987 | Crooks | 330/149 |
| 5,300,896 | A | 4/1994 | Suesserman | |
| 5,781,068 | A * | 7/1998 | Takita | 330/85 |
| 6,249,696 | B1 | 6/2001 | Olson et al. | |
| 6,396,343 | B2 | 5/2002 | Chee | |
| 6,844,775 | B2 | 1/2005 | Doorenbos et al. | |
| 7,078,965 | B2 * | 7/2006 | Laletin | 330/48 |
| 7,368,999 | B2 | 5/2008 | Natzke | |
| 7,521,994 | B2 | 4/2009 | Theus et al. | |
| 2002/0000883 | A1 | 1/2002 | Cox | |
| 2002/0060915 | A1 | 5/2002 | Pomeroy | |
| 2003/0206054 | A1 | 11/2003 | Jin et al. | |
| 2004/0077326 | A1 | 4/2004 | Shi | |
| 2006/0176109 | A1 | 8/2006 | Huijsing et al. | |
| 2007/0013440 | A1 | 1/2007 | Chen et al. | |
| 2007/0296496 | A1 | 12/2007 | Blumen | |
| 2009/0066419 | A1 | 3/2009 | Lee et al. | |

OTHER PUBLICATIONS

PCT International Search Report and Written Opinion mailed on Mar. 22, 2012 in PCT/US2012/021331 in 15 pages.
Wang, et al., Low-power instrumental amplifier for portable ECG, IEEE, 2009, pp. 4, Piscataway, United States of America.
Stitt, R. Mark, "AC Coupling Instrumentation and Difference Amplifiers", 1990.
Fortunato, Mark, "A New Filter Topology for Analog High-Pass Filters", 2008.
Analog Devices, "Low Cost 270 MHz Differential Receiver Amplifiers AD8129/AD8130", 2005.

* cited by examiner

*Primary Examiner* — Patricia Nguyen
(74) *Attorney, Agent, or Firm* — Knobbe Martens Olson & Bear LLP

(57) ABSTRACT

Apparatus and methods reduce the likelihood of amplifier saturation due to propagated DC offsets, and reduce the recover from saturated stated when such saturation occurs. Advantageously, these attributes are beneficial for monitoring of bioelectric signals. A circuit uses an instrumentation amplifier connected as a high pass filter to attenuate large DC offsets and amplify small signals. The circuit can include an instrumentation amplifier electrically coupled with a first feedback circuit including at least one resistor and a second feedback circuit including an op-amp. The feedback circuit can also include a low-pass filter. The op-amp in the second feedback circuit can be configured as a non-inverting amplifier, an inverting amplifier, and/or an integrator circuit. Alternatively, the circuit can include an instrumentation amplifier with one feedback circuit including at least one resistor, and a coupling capacitor electrically coupled with a reference voltage.

20 Claims, 12 Drawing Sheets

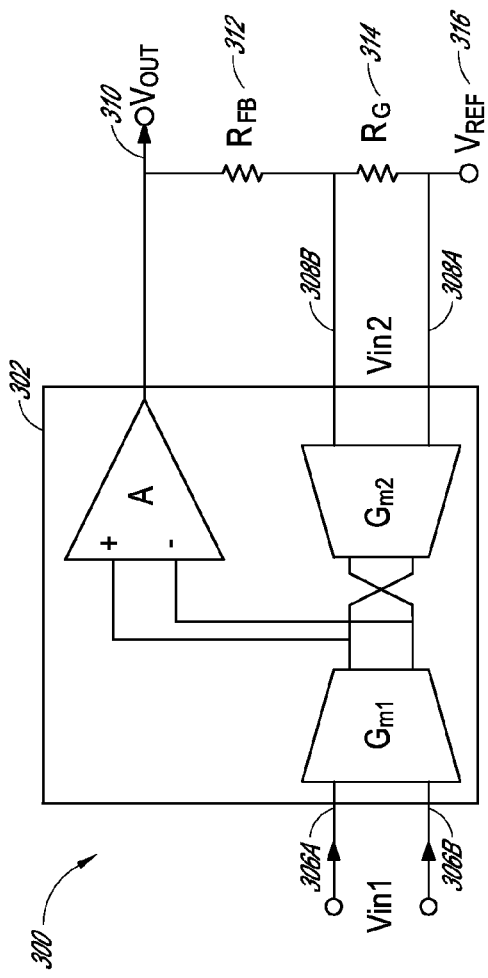
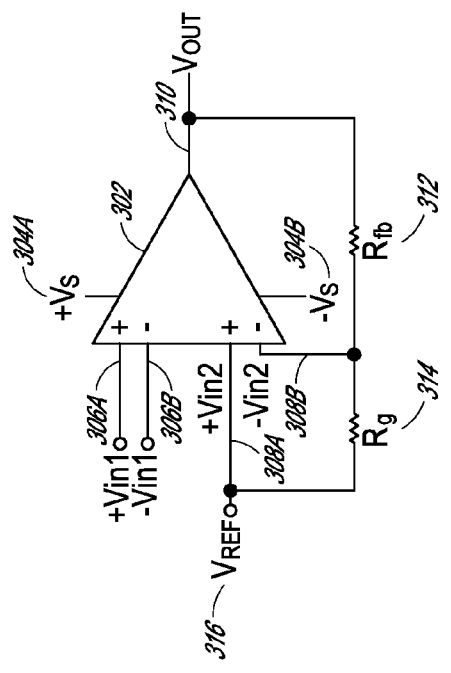
FIG. 3A
FIG. 3B

APPARATUS AND METHOD FOR AMPLIFICATION WITH HIGH FRONT-END GAIN IN THE PRESENCE OF LARGE DC OFFSETS

BACKGROUND

1. Field

Embodiments of the disclosure relate to electronic devices, and more particularly, in one or more embodiments, to instrumentation amplifiers.

2. Description of the Related Technology

In some electronic systems, large DC offsets, which may also be referred to as the DC component of a signal, are present with relatively low-voltage data signals. The size of a "large" DC offset may vary from system to system. For example, in some systems, a 1000 millivolt (mV) offset is considered large, while in others, a 300 mV offset is considered large. Processing low-voltage signals in the presence of large DC offsets can be difficult. For example, when measuring small biopotential signals, relatively large differential DC offsets can appear due to respiration, muscular activity, and the like. In some cases, when measuring biopotential signals, the DC offset may be as high as 500 mV, while the biopotential signals themselves may be only a few mV.

In certain electronic measurement systems, amplifying biopotential signals with a large DC offset can cause significant problems. Amplifying the biopotential signals with a substantial gain may cause an amplifier of the system to saturate due to the large DC offset. Amplifying the biopotential signals with a relatively small gain may make it difficult to resolve the small biopotential signals, and lead to additional and more expensive filtering and gain stages later on. This problem is exacerbated in portable devices in which low supply voltages are used. Thus, a large DC offset makes it difficult to have high gain in the front-end of the measurement system.

Conventional solutions to this problem have involved low gain amplifier circuits to avoid saturating the system followed by a certain form of high pass filtering and additional gain stages. However, these solutions have resulted in additional signal filtering being performed by an expensive and slower digital signal processor (DSP), additional gain stages and filtering, expensive analog-to-digital (ADC) converters, and/or other circuit disadvantages.

SUMMARY

An electrical circuit, or apparatus, is described that includes an instrumentation amplifier circuit including an instrumentation amplifier, a plurality of first input nodes, a first output node, a feedback resistor electrically coupled between the first output node and at least one of the plurality of first input nodes, a first gain setting resistor electrically coupled between at least one of the plurality of first input nodes and at least one other node. The electrical circuit also includes a feedback circuit including at least one operational amplifier, at least one input electrically coupled to the first output node, and a second output node directly or indirectly coupled to at least one of the plurality of first input nodes.

In certain embodiments, the electrical circuit further includes an operational amplifier circuit including the operational amplifier, and a plurality of second input nodes, wherein the second output node is electrically coupled to at least one of the plurality of second input nodes. In certain embodiments, the electrical circuit further includes a low pass filter circuit electrically coupled with the at least one input of the feedback circuit and at least one of the plurality of second input nodes.

In certain embodiments, the apparatus further includes a second gain setting resistor electrically coupled between the second output node and at least one of the plurality of first input nodes and the operational amplifier circuit further includes a first resistor electrically coupled between a selected one of the plurality of second input nodes and a voltage reference, and a second resistor electrically coupled between the second output node and the selected one of the plurality of second input nodes. In certain embodiments, the second output node is electrically coupled to the at least one of the plurality of first input nodes via a second gain setting resistor.

In certain embodiments, the second output node is electrically coupled directly to at least one of the plurality of second input nodes, and the first gain setting resistor is electrically coupled between the second output node and the at least one of the plurality of first input nodes.

In certain embodiments, the feedback circuit further includes an integrator circuit including the operational amplifier, wherein the operational amplifier is in an inverting configuration, a plurality of second input nodes, a resistor disposed in a signal path between the at least one input of the feedback circuit and at least one of the second input nodes, and a capacitor electrically coupled between the second output node and the at least one of the second input nodes, wherein the second output node is electrically coupled to a non-inverting input of the plurality of first input nodes.

In certain embodiments, a DC component of the signal has a gain of approximately zero and an AC component has a gain of at least one. In certain embodiments, at least one of the plurality of first input nodes is electrically coupled to an electrode and receive a signal indicative of a physiological parameter. In certain embodiments, a DC component of the signal has a gain of less than approximately two and an AC component has a gain of greater than approximately one. In certain embodiments, the DC component of the signal has a gain of less than approximately two and an AC component has a gain of greater than approximately twenty. In certain embodiments, the apparatus further amplifies the AC component of the signal by at least fifty, while the gain of the DC component is still relatively small. In certain embodiments, the apparatus further amplifies the AC component of the signal by at least 100, while the gain of the DC component is still relatively small. In certain embodiments, the apparatus amplifies the further AC component of the signal by at least 500, while the gain of the DC component is still relatively small. In certain embodiments, the apparatus further includes a high pass filter circuit electrically coupled to the first output node. In certain embodiments the high pass filter includes at least a resistor and a capacitor.

In certain embodiments, the apparatus further includes a switching circuit configured to determine when the instrumentation amplifier circuit has saturated, and at least partly in response to the determination, to activate at least one switch, the at least one switch configured to reduce a time constant of an associated filter to reduce a recovery time of an output signal of the instrumentation amplifier circuit from that of a saturated state.

In certain embodiments an apparatus includes an instrumentation amplifier circuit including an instrumentation amplifier, a plurality of input nodes, wherein at least a first input node of the plurality of input nodes is electrically coupled to a first voltage reference, an output node, a feedback resistor electrically coupled between the output node and at least one of the plurality of first input nodes, and a first gain setting resistor electrically coupled between at least one of the plurality of first input nodes and at least one other node, wherein a gain of the instrumentation amplifier is determined by a value of the gain setting resistor, wherein with the gain setting resistor; and a first capacitor electrically coupled between a second input node of the plurality of input nodes and a second reference voltage.

In certain embodiments an apparatus includes an instrumentation amplifier circuit including an instrumentation amplifier, a plurality of first input nodes, a first output node, a feedback resistor electrically coupled between the first output node and at least one of the plurality of first input node, and a first gain setting resistor electrically coupled between at least one of the plurality of first input nodes and at least one other node, wherein a gain of the instrumentation amplifier is determined at least by a value of the gain setting resistor. In certain embodiments, the apparatus further includes a second gain setting resistor electrically coupled between a voltage source and at least one of the plurality of first input nodes. In certain embodiments, the voltage source is approximately equal to a DC component of an input signal such that the DC component of the input signal is attenuated by the instrumentation amplifier circuit.

BRIEF DESCRIPTION OF THE DRAWINGS

FIGS. 3A and 3B are block diagrams illustrating an embodiment of an instrumentation amplifier.

DETAILED DESCRIPTION OF EMBODIMENTS

Figure 1:
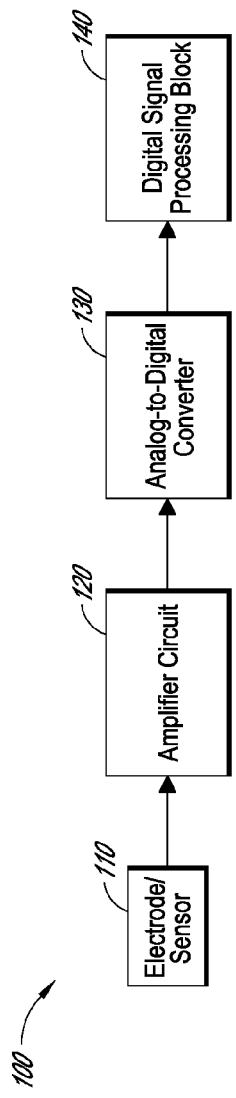
FIG. 1 is a schematic block diagram of one embodiment of an electronic system for measuring and processing a signal.

The following detailed description of certain embodiments presents various descriptions of specific embodiments of the disclosure. However, the other embodiments of the disclosure can be implemented in a multitude of different ways as defined and covered by the claims. In this description, reference is made to the drawings where like reference numerals indicate similar elements.

As used herein, DC offset may also be referred to as the DC component of a signal and is not limited to purely DC voltages, but may also include relatively low frequency AC components of a signal, as determined by the overall gain value of the system and the gain and cutoff frequency of the feedback circuit.

As used herein, attenuating a DC component of a signal can include both having a gain of approximately or less than approximately one, as well as having a gain that is substantially less than the gain of the AC component of the signal.

Overview of Electronic Signal Measurement System

Referring to FIG. 1, an electronic system for measuring a signal according to one embodiment will be described below. The illustrated system 100 includes an electrode 110, an amplifier circuit 120, an analog-to-digital converter (ADC) 130 and a digital signal processing (DSP) block 140.

The electrode 110 is configured to receive a signal from a source. In certain embodiments, the electronic system can be a measurement system for measuring a signal from a human body. Examples of such electronic systems can include, but are not limited to, medical devices such as an electro-oculogram (EOG) devices, electroencephalogram (EEG) devices, electrocardiogram (ECG) devices, electromyogram (EMG) devices, ultrasound devices, and pressure sensors. The electronic system 100 can also be used for measuring relatively small signals in any other environments in the presence of relatively large DC offsets, or when large AC signal gains are desired but DC gain is not desired.

In certain embodiments in which the electronic system is a medical device, the source can be a human body, in which case the signal is a biopotential signal indicative of any number of physiological parameters, such as heart activity, brain activity, respiratory activity, muscle activity, or the like. For example, the electronic system can be used for measuring the heart rate of a human body and can be part of, for example, a treadmill machine. In such an example, the electrode 110 can be in a form of a bar that can be grasped by a user's hands. In other embodiments, the electrode 110 can be a wire, or some other communication path, within an electronic system.

The amplifier circuit 120 can receive a signal from the electrode 110 and process it. In certain embodiments, the amplifier circuit 120 can amplify the signal and attenuate the DC offset, or DC component, from the signal. In another embodiment, the amplifier circuit 120 can merely amplify the signal and the removal of the DC component and other filtering can occur at the analog-to-digital converter 130 and/or the digital signal processing block 140.

The analog-to-digital converter (ADC) 130 can convert the analog signal into a digital signal that can be processed using the digital signal processing block 140. The ADC 130 can be any suitable ADC.

The digital signal processing (DSP) block 140 can correspond to a general-purpose digital signal processor, licensable core, microprocessor, or the like, and can process the digital signal from the ADC 130 according to instructions stored in a tangible, non-transitory, hardware-readable memory. The DSP block 140 can perform any suitable operations on the signals. In certain embodiments, the DSP block 140 computes health related information regarding biopotential signals, such as an electro-oculogram (EOG), electroencephalogram (EEG), electrocardiogram (ECG), electromyogram (EMG), an axon action potential (AAP), or the like. In another embodiment, the DSP block 140 performs additional filtering and processing on the signal. The DSP block 140 can also be implemented by hardware or by a combination of hardware and software/firmware.

Amplifier Circuit

Figure 2:
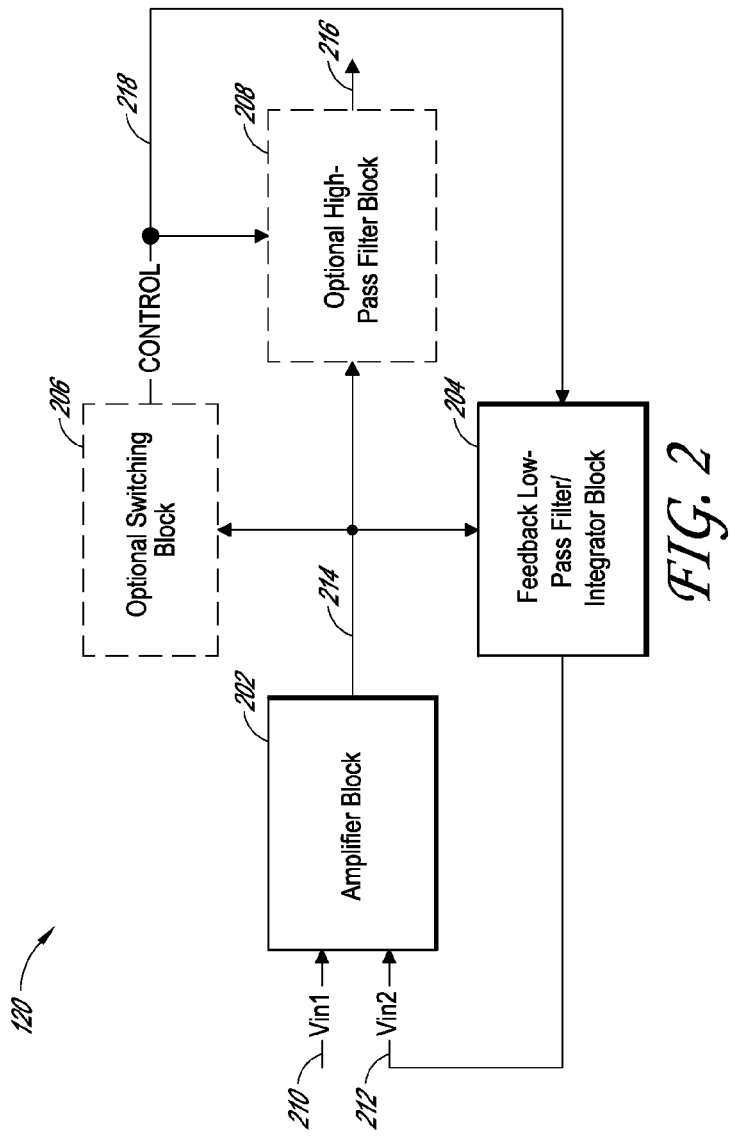
FIG. 2 is a schematic block diagram illustrating one embodiment of an amplifier circuit of the electronic system of FIG. 1.

Referring to FIG. 2, one embodiment of an amplifier circuit for use in an electronic system for measuring a signal will be described below. The amplifier circuit can be, for example, the amplifier circuit 120 of FIG. 1. In the illustrated embodiment, the amplifier circuit 120 includes an amplifier block 202 and a feedback block 204. In certain embodiments, the amplifier also includes an optional switching block 206 and/or an optional high-pass filter ("HPF") block 208.

The amplifier block 202 can be used to amplify incoming signals. In certain embodiments, the amplifier block 202 can produce a relatively large signal gain of the AC component, while maintaining the gain of the DC component to a relatively low amount, such as one (0 dB) or less than one. In certain embodiments, the signal gain of the AC component is at least 20. In another embodiment, the signal gain the AC component is at least 100. In another embodiment, the signal gain the AC component is at least 500. These minimum signal gain levels are impractical to achieve in the prior art because of problems with amplifier saturation. The amplifier block 202 can be implemented in a number of ways. For example, the amplifier block 202 may include an operational amplifier (op-amp), instrumentation amplifier, differential amplifier, or some other device capable of amplifying the differential signal input and attenuating common mode. In certain embodiments, the instrumentation amplifier may be a direct current mode instrumentation amplifier (also referred to as a direct current feedback instrumentation amplifier). In another embodiment, the instrumentation amplifier can be an indirect current mode (ICM) instrumentation amplifier (also referred to as an indirect current feedback instrumentation amplifier). Various embodiments of the amplifier block 202 will be described in greater detail below with reference to FIGS. 3-8.

The feedback block 204 can further process the output of the amplifier block 202 and provide some type of feedback to the amplifier block 202. In certain embodiments, the feedback block 204 attenuates a high frequency component of the signal. In certain embodiments, the feedback block 204 can amplify a DC component of the signal. The feedback block 204 can also be implemented in a variety of ways. For example, the feedback block 204 can include one or more of high-pass filters (HPF), low-pass filters (LPF), band-pass filters, integrators, differentiators, gain stage amplifiers, resistors, capacitors, inductors, or other circuits. The HPFs and LPFs can be implemented as active filters or passive filters. Various embodiments of the feedback block 204 will be described in greater detail below with reference to FIGS. 4-8.

The HPF block 208 can further process the output 214 of the amplifier block 202 prior to sending it to the ADC 130 (FIG. 1). The HPF block 208 can be used to attenuate unwanted noise and further improve the signal characteristics. The HPF block 208 may be implemented in a variety of ways, using components similar to those described above with reference to the feedback block 204. Furthermore, the HPF block 208 may be implemented as a passive filter or an active filter.

The switching block 206 can monitor the output of the amplifier block 202, and can alter the characteristics of the HPF block 208 and/or feedback block 204 based on the characteristics of the output. In certain embodiments, when the amplifier block 202 saturates, the switching block 206 decreases the amplifier block 202 recovery time by activating switches coupled with resistors such that time constants associated with RC circuits of filter circuits associated with the amplifier block 202 can be reduced. Such RC circuits can be part of, for example, a low pass filter block 414 or an optional high pass filter block 412, both of which will be described in greater detail later in connection with FIG. 4. The switching block 206 may also be implemented in a variety of ways and include a number of different circuit components.

The signal path of the amplifier circuit 120 will now be described in greater detail. A first voltage signal 210 enters the amplifier circuit 120, and is provided to the input $V_{in1}$ of the amplifier block 202 as an input signal. A second voltage signal 212 is provided to the input $V_{in2}$ of the amplifier block 202 as a feedback signal.

In response to the signals 210, 212, the amplifier block 202 outputs an amplifier output signal 214. The amplifier output signal 214 is further processed by the feedback block 204, and fed back into the amplifier block 202 as the feedback signal 212. In certain embodiments, the feedback block 204 can attenuate the high frequency component of the output signal 214 and amplify a DC component of the amplifier output signal 214. The amplifier block 202 can use the feedback signal 212 to further process the signal input 210. As mentioned previously, prior to feeding back the feedback signal 212 to amplifier block 202, the feedback block 204 may further perform any number of operations on the signal, such as filtering, amplifying, integrating, or the like.

Prior to leaving the amplifier circuit 120, the output signal 214, 216 may be further filtered by the optional HPF block 208. As mentioned above, the HPF filter block 208 can remove unwanted noise or signal characteristics and further prepare the signal for processing at the ADC 130 (FIG. 1).

Upon initialization, there may exist some amount of time delay before the amplifier circuit 120 can accurately produce an output based on the signal input. In other instances, relatively fast changes to the signal input can cause the amplifier block 202 to saturate. For example, if a hand touching an electrode is quickly removed and then replaced, the amplifier block 202 may saturate, resulting in the output signal 214 swinging to a voltage supply rail, such as to the voltage source connected to the voltage source inputs $+V_s$ 304A or $-V_s$ 304B.

Accordingly, during those times, it may be beneficial to control the characteristics of the feedback block 204 and the HPF block 208. The switching block 206 can be used to control the feedback block 204 and HPF block 208, using a control signal 218. The switching block 206 can monitor the amplifier output signal 214. Based on the characteristics of the amplifier output signal, the switching block 206 can determine when to alter the characteristics of the HPF block 208 and/or the feedback block 204. At times when the amplifier block 202 saturates, or other times when desired, the switching block 206 can decrease the amplifier block recovery time, as will be described in greater detail below with reference to FIG. 9. Thus, the overall amplifier circuit performance can be improved by the use of the switching block 206 and the control signal 218.

Instrumentation Amplifier

FIG. 3A is a block diagram of an embodiment of an indirect current mode ("ICM") instrumentation amplifier topology 300 that can be used as the amplifier block 202 of FIG. 2. First differential input terminals 306A, 306B for input signal $V_{in1}$ can correspond to the signal 210 (FIG. 2) and can, for example, be coupled to the electrode/sensor 110 (FIG. 1). Second differential input terminals 308A, 308B for input signal $V_{in2}$ can correspond to the signal 212 (FIG. 2) and can be used to receive a feedback signal. One example of an ICM instrumentation amplifier is an AD8129, which is available from Analog Devices, Inc., of Norwood, Mass., U.S.A. In alternative embodiments, other instrumentation amplifier topologies can be used. An example of a typical three op-amp instrumentation amplifier is an AD620, which is also available from Analog Devices, Inc. An example of a typical two op-amp instrumentation amplifier is AD8236, also available from Analog Devices, Inc. FIG. 3B is a circuit diagram of an embodiment of an ICM instrumentation amplifier topology 300 similar to the block diagram of FIG. 3A. The ICM amplifier topology includes an instrumentation amplifier 302, voltage source inputs 304A, 304B (not shown in FIG. 3A), positive voltage terminals 306A, 308A ($+V_{in1}$ and $+V_{in2}$, respectively), negative voltage terminals 306B, 308B ($-V_{in1}$ and $-V_{in2}$, respectively), a feedback resistor $R_{fb}$ 312, a gain setting resistor $R_g$ 314 and a reference voltage $V_{ref}$ 316. The voltage inputs, or voltage source inputs $+V_s$ 304A, $-V_s$ 304B can be connected to any number of different voltage sources. For example, the voltage source inputs $+V_s$ 304A, $-V_s$ 304B can be connected to voltage sources with opposite voltage signals. Alternatively, one voltage source input can be connected to ground, while the other voltage source input is connected to a positive or negative voltage source. In the illustrated embodiment, the reference voltage ($V_{ref}$) 316 is tied directly to the positive input terminal $+V_{in2}$ 308A, however, the voltage reference $V_{ref}$ 316 may be tied to other inputs of the instrumentation amplifier 302, as will be described in greater detail below. Furthermore, throughout the description it is to be understood that the various voltage references may share a common voltage or may be tied to different reference voltages. In certain embodiments, the voltage reference may be ground. In addition, in certain embodiments, different, fewer, or more components may be used as part of the ICM instrumentation amplifier topology, as will be discussed in greater detail below.

As illustrated in FIGS. 3A and 3B, the output $V_{out}$ 310 of the instrumentation amplifier is fed back into the input $-V_{in2}$ 308B using the feedback resistor $R_{fb}$ 312 and the gain setting resistor $R_g$ 314. One end of the feedback resistor $R_{fb}$ 312 is connected to the output Vout 310. The other end of the feedback resistor $R_{fb}$ 312 is connected to the input $-V_{in2}$ and one end of the gain setting resistor $R_g$ 314. The other end of the gain setting resistor $R_g$ 314 is connected to the voltage reference $V_{ref}$ 316 and the input $+V_{in2}$ 308A. In addition, the $V_{ref}$ 316 is tied directly to the input $+V_{in2}$ 308A and is further tied to the input $-V_{in2}$ via the gain setting resistor $R_g$ 314. The gain of the ICM instrumentation amplifier topology 300 can be described in Equation (1) below:

$$V_{gain} = 1 + \frac{R_{fb}}{R_g} \quad \text{Equation (1)}$$

The $V_{out}$ 310 of the ICM instrumentation amplifier topology 300 can be described in Equation (2) below:

$$V_{out} = V_{ref} + \left(1 + \frac{R_{fb}}{R_g}\right) * V_{in1} \quad \text{Equation (2)}$$

As noted above, the ICM instrumentation amplifier topology 300 may be altered in a variety of ways without departing from the spirit and scope of the description. For example, the topology may include different, fewer, or more components.

Amplifier Circuit with High Front-End Gain in the Presence of Large DC Offsets

Figure 4:
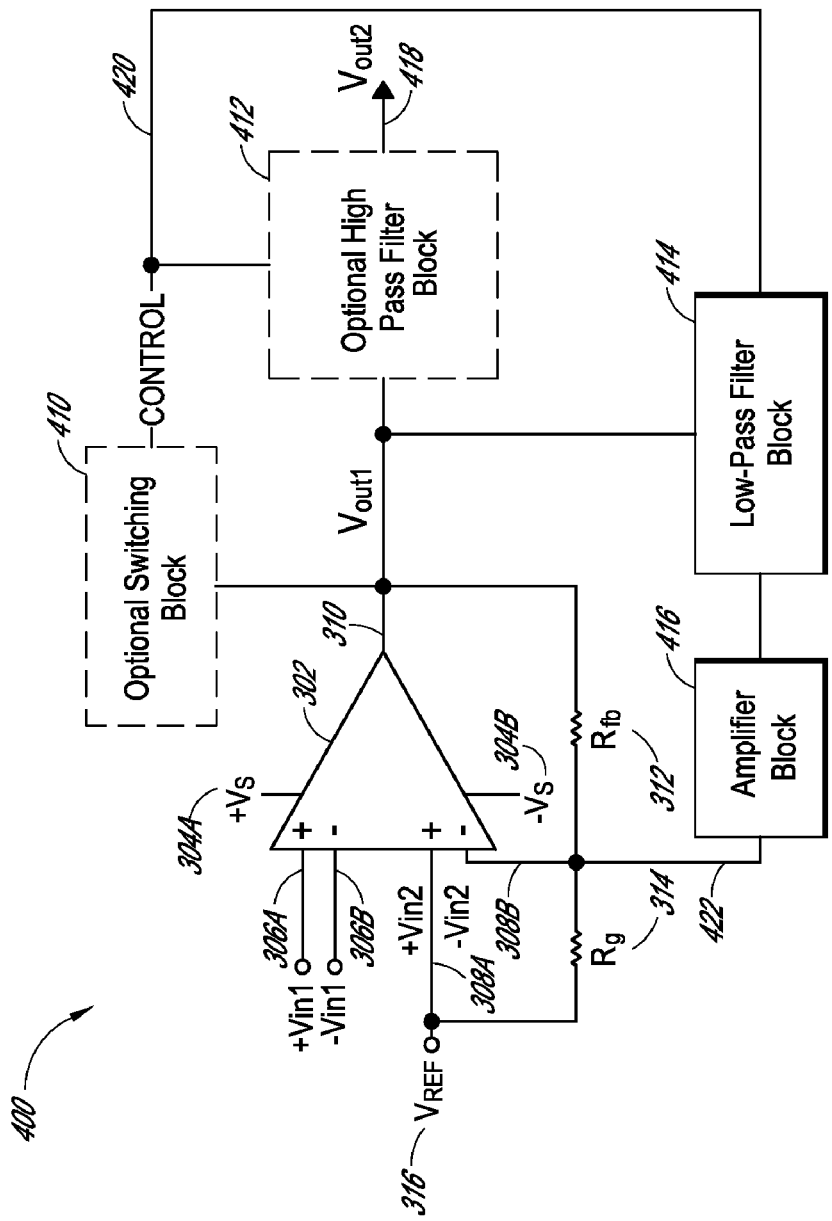
FIG. 4 is a circuit diagram illustrating one embodiment of an instrumentation amplifier circuit configured as a high-pass filter

FIG. 4 is a block diagram of one embodiment of an amplifier circuit having the ICM amplifier topology 300 of FIG. 3.

The ICM amplifier topology 300 can represent one implementation of the amplifier block 202 of FIG. 2.

Thus, the voltage output $V_{out1}$ 310 of the instrumentation amplifier 302 is fed back into the input $-V_{in2}$ 308B via the feedback resistor $R_{fb}$ 312 as well as through the low-pass filter (LPF) block 414 and the optional second amplifier block 416. The feedback loop further includes the gain setting resistor $R_g$ 314. One end of the gain setting resistor $R_g$ 314 is connected with the input $-V_{in2}$ 308B and the feedback resistor $R_{fb}$ 312. The other end of the gain setting resistor $R_g$ 314 is connected with the voltage reference $V_{ref}$ 316 and the input $+V_{in2}$. As mentioned previously, the output $V_{out1}$ 310 is also used by the switching block 410 (which corresponds with the switching block 206 of FIG. 2) to control the HPF block 412 (which corresponds to the HPF block 208 of FIG. 2) and the LPF block 414. As mentioned previously, the different blocks may be implemented using a variety of circuit components without departing from the spirit and scope of the disclosure.

Similarly, the LPF block 414 and the second amplifier block 416 may be implemented in a variety of ways using various circuit components, as described in greater detail below. As illustrated, the output 422 of the amplifier block 416 is fed back into the input $-V_{in2}$ 308B of the instrumentation amplifier 302. The feedback signal is used to process the input signal and produce the output signal $V_{out1}$ 310. In certain embodiments, the feedback signal is used to remove or otherwise attenuate the DC offset, or DC component, from the output signal $V_{out1}$ 310.

Figure 5A:
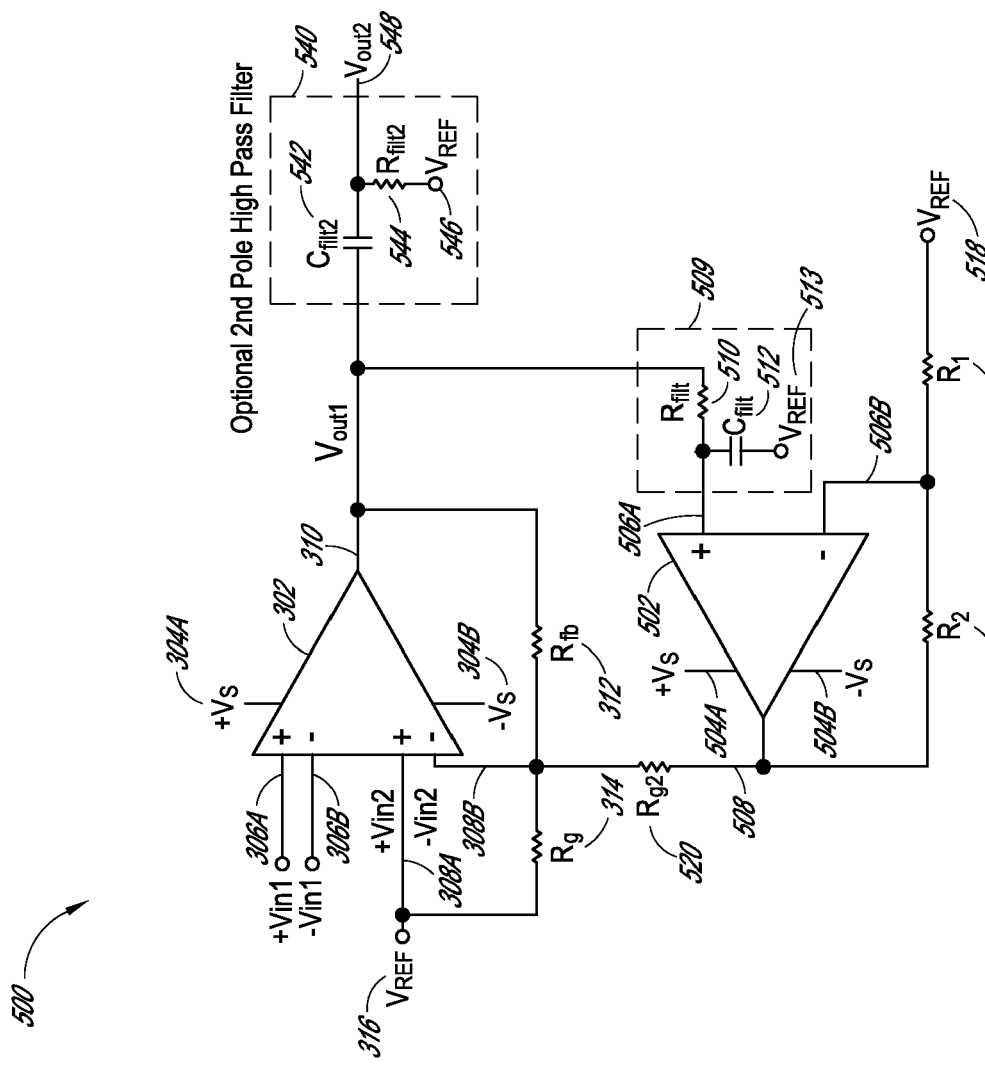
FIGS. 5A and 5B are circuit diagrams illustrating embodiments of an instrumentation amplifier circuit configured as a high-pass filter.
Figure 5B:
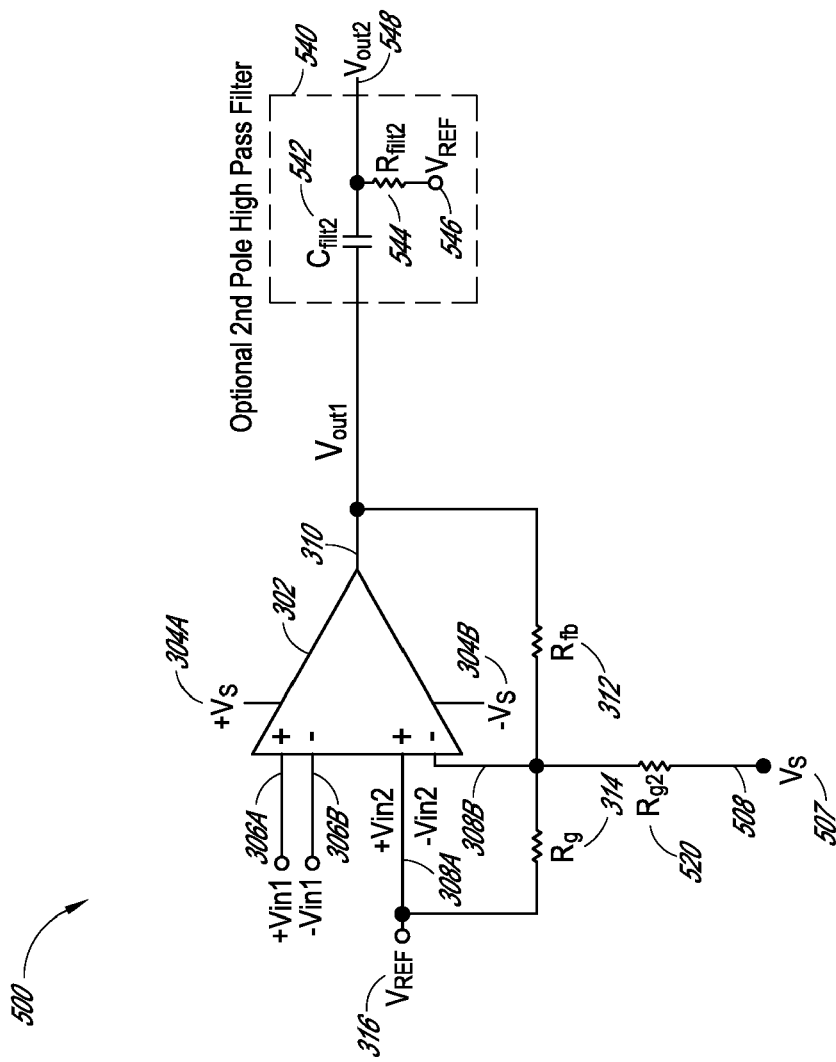
Figure 6:
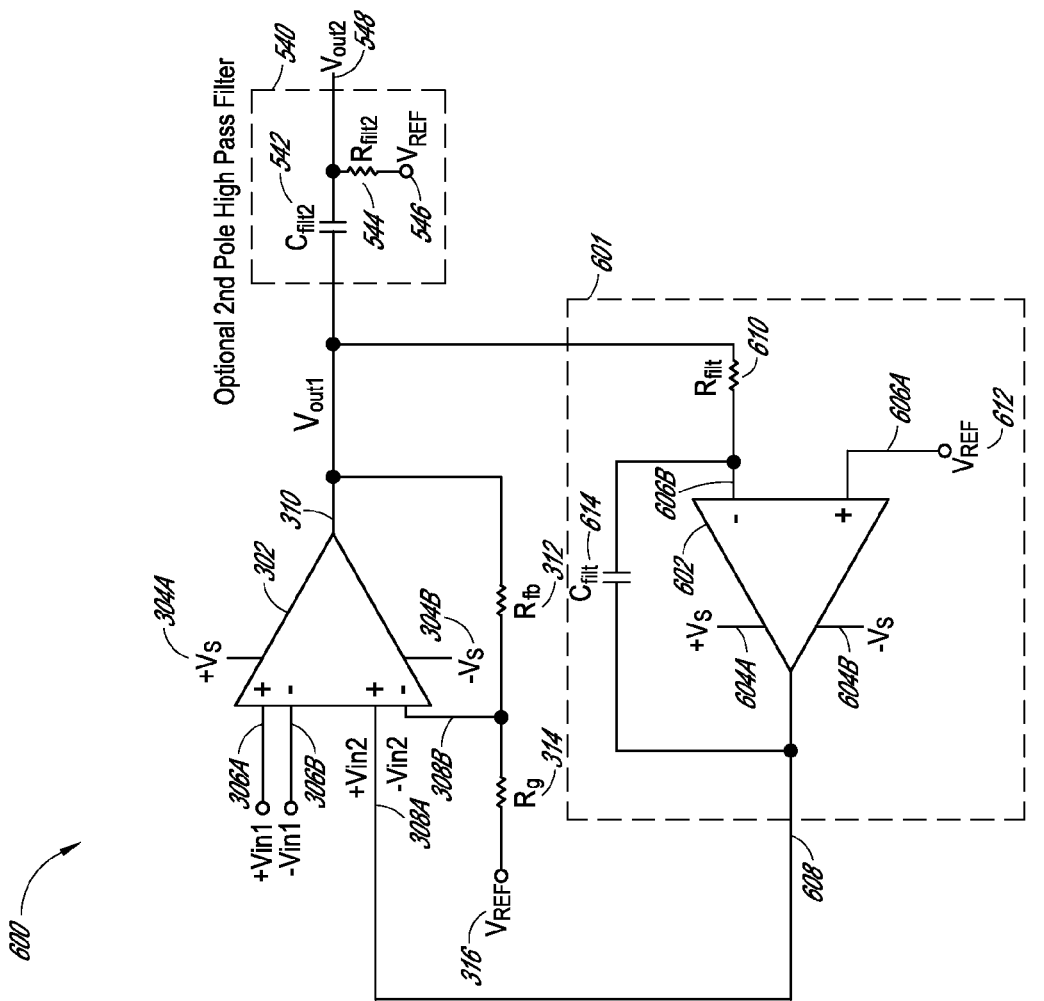
FIG. 6 is a circuit diagram illustrating yet another embodiment of an instrumentation amplifier circuit configured as a high-pass filter.
Figure 7A:
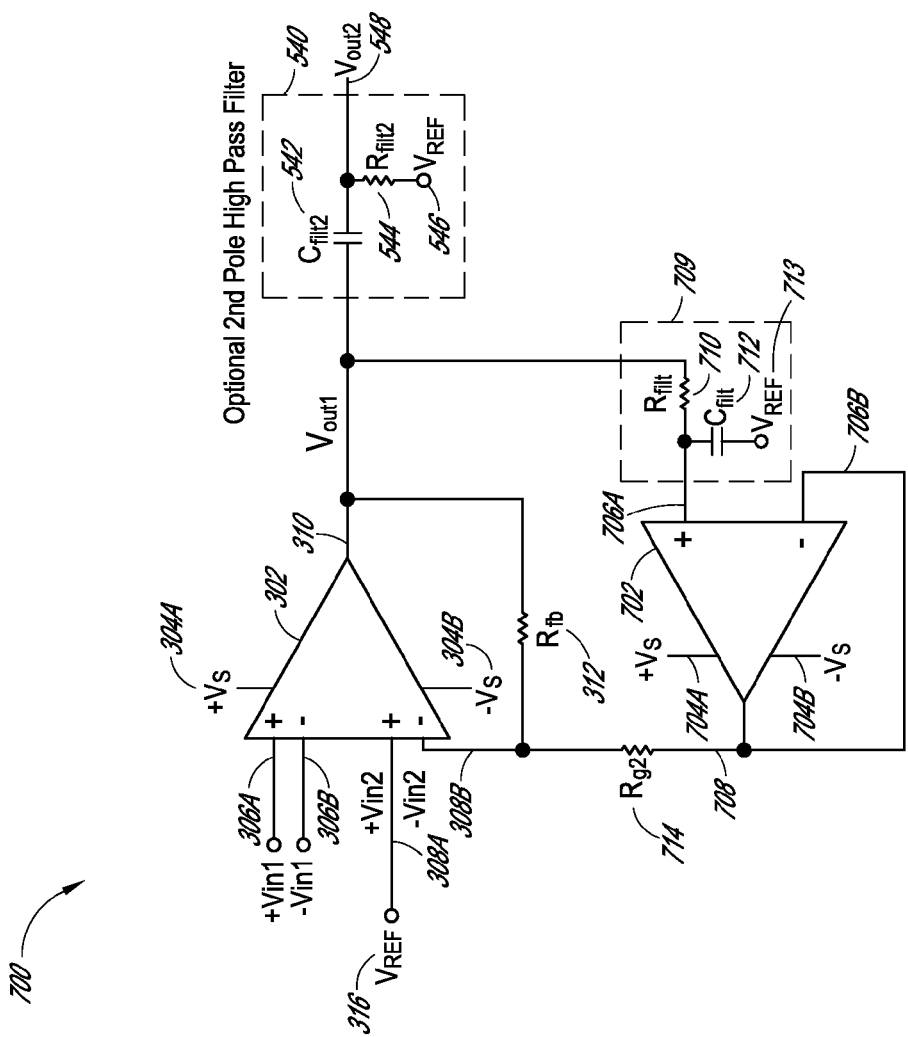
FIGS. 7A and 7B are circuit diagrams illustrating embodiments of an instrumentation amplifier circuit configured as a high-pass filter.
Figure 7B:
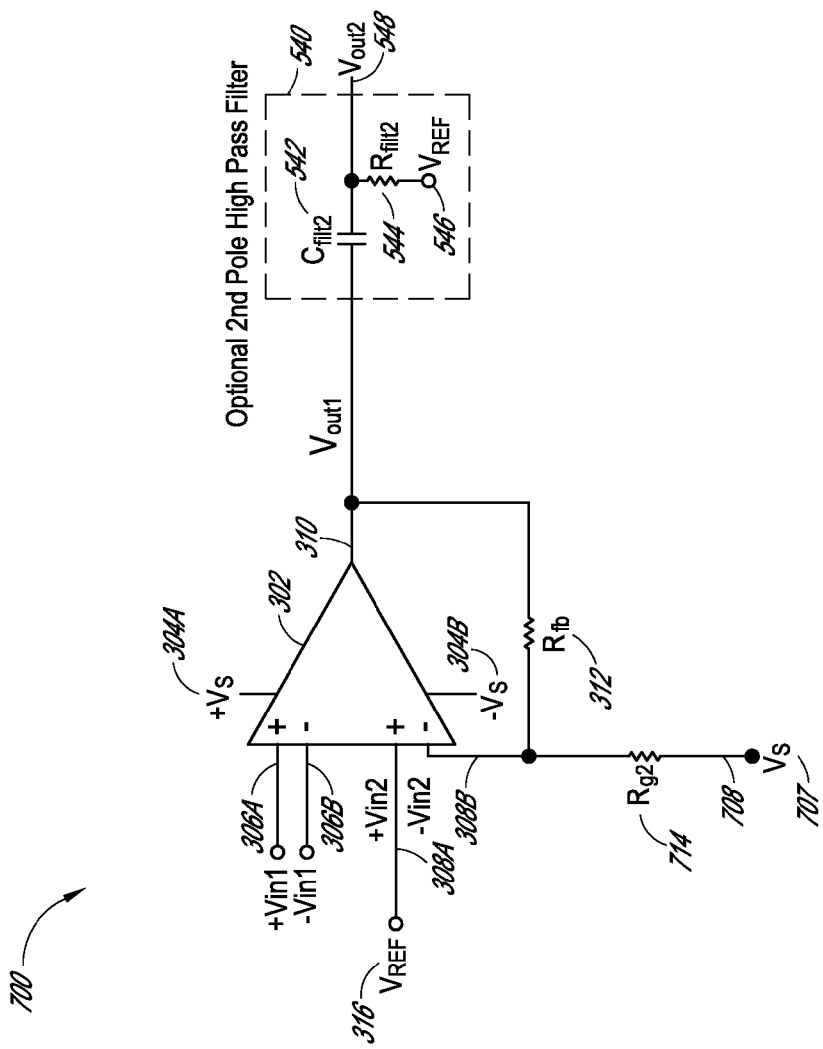
Figure 8:
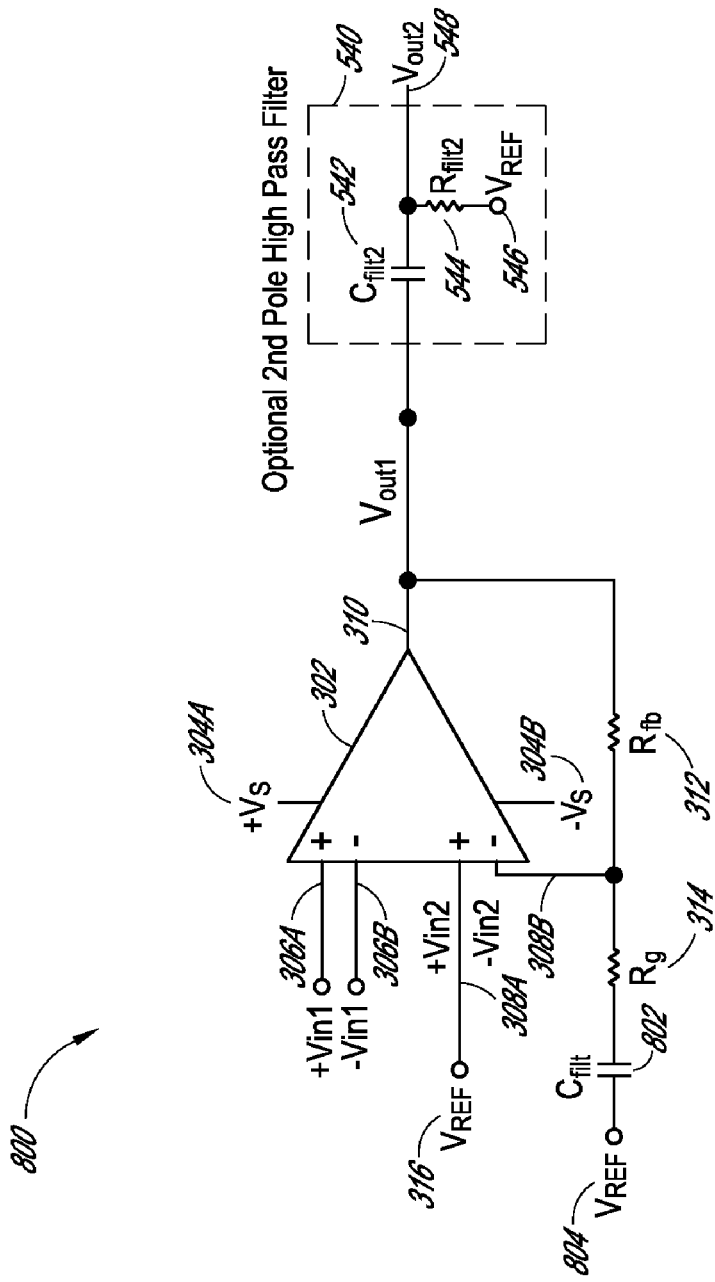
FIG. 8 is a circuit diagram illustrating yet another embodiment of an instrumentation amplifier circuit configured as a high-pass filter.
Figure 9:
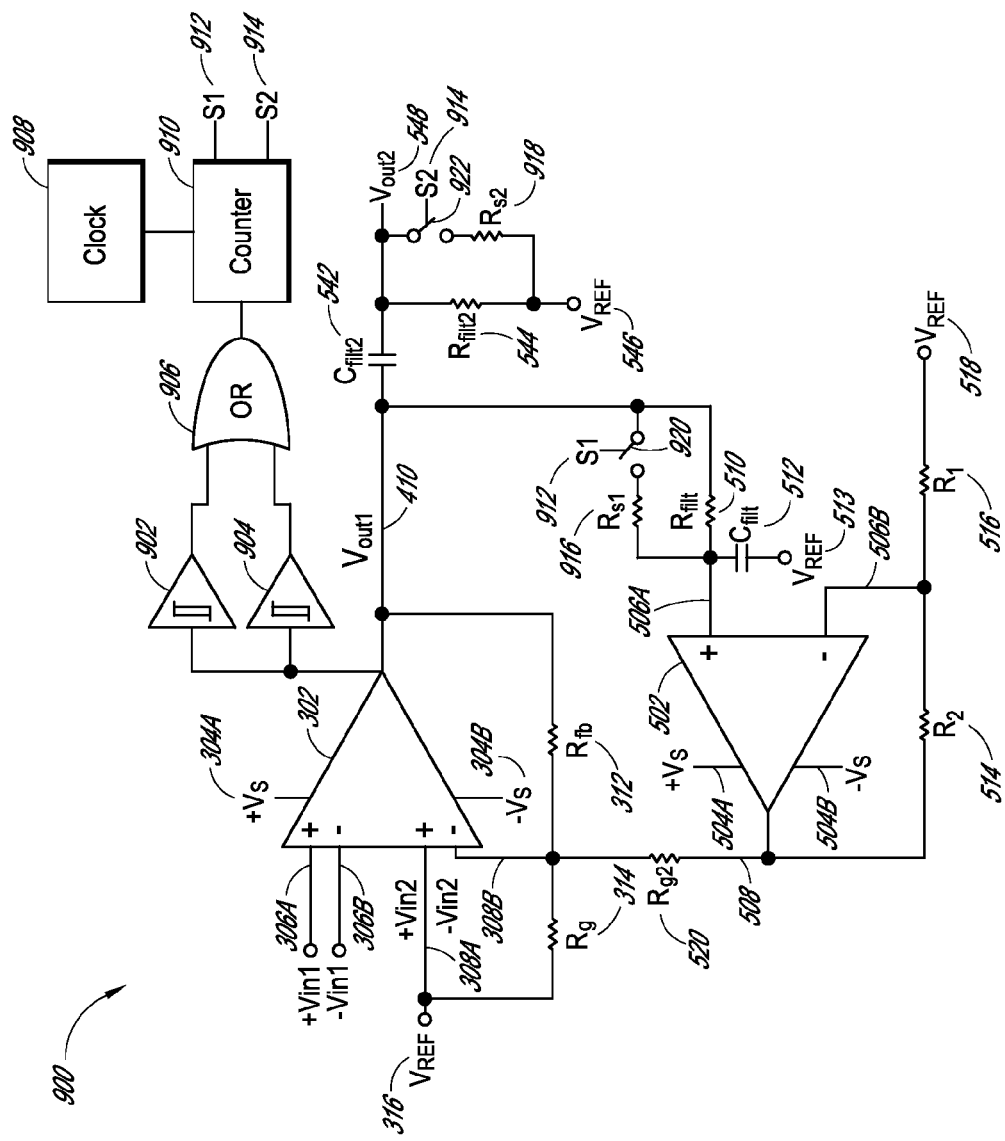
FIG. 9 is a circuit diagram illustrating yet another embodiment of an instrumentation amplifier circuit configured as a high-pass filter with switching circuitry.

FIGS. 5-9 are circuit diagrams illustrating various embodiments of the circuits described in connection with FIGS. 2 and 4. FIG. 5A is a circuit diagram illustrating one embodiment of an instrumentation amplifier with a LPF and amplifier feedback. FIG. 5B is a circuit diagram illustrating one embodiment of an instrumentation amplifier using a voltage source to attenuate the DC offset. FIG. 6 is a circuit diagram illustrating one embodiment of an instrumentation amplifier with an integrator feedback circuit. FIG. 7A is a circuit diagram illustrating one embodiment of an instrumentation amplifier with a low pass filter and unity gain buffer used in feedback. FIG. 7B is a circuit diagram illustrating one embodiment of an instrumentation amplifier using a voltage source to attenuate the DC offset. FIG. 8 is a circuit diagram illustrating one embodiment of an instrumentation amplifier with a non-amplifier feedback. FIG. 9 is a circuit diagram illustrating one embodiment of an instrumentation amplifier configured as a HPF with switching circuitry. The individual figures will now be described in greater detail.

FIG. 5A illustrates a circuit diagram of one embodiment of an amplifier circuit capable of achieving a high front-end gain while avoiding saturation. The circuit 500 is further capable of maintaining a relatively small gain, or no gain, for the DC offset of the signal. The amplifier circuit 500 can include various components of the instrumentation amplifier topology of FIG. 3, including an instrumentation amplifier 302, voltage source inputs 304A, 304B, a first positive terminal $+V_{in1}$ 306A, a first negative terminal $-V_{in1}$ 306B, a second positive terminal $+V_{in2}$ 308A, a second negative terminal $-V_{in2}$ 308B at, a voltage output $V_{out1}$ 310, a feedback resistor $R_{fb}$ 312, a gain setting resistor $R_g$ 314 and a reference voltage $V_{ref}$ 316. The circuit 500 can further include a low pass filter (LPF) 509 and a non-inverting amplifier in feedback with the instrumentation amplifier 302.

In certain embodiments, the LPF 509 can be implemented using a filter resistor ($R_{filt}$) 510 in series with the non-inverting amplifier, and a filter capacitor $C_{filt}$ 512, which shares one end with the resistor $R_{filt}$ 510 and positive terminal 506A. The other end of the capacitor $C_{filt}$ 512 is connected to the voltage reference $V_{ref}$ 513. The cutoff frequency for the LPF 509 can be expressed in Equation (3) below.

$$f_c = \frac{1}{2\pi\tau} = \frac{1}{2\pi R_{filt} * C_{filt}} \quad \text{Equation (3)}$$

The non-inverting amplifier may be implemented using an op-amp 502 with source voltage inputs +$V_s$ 504A, −$V_s$ 504B, a positive input terminal 506A, a negative input terminal 506B, and a voltage output $V_{out}$ 508, as well as a feedback resistor R2 514, a gain setting resistor R1 516 and a reference voltage $V_{ref}$ 518. The voltage inputs, or voltage source inputs +$V_s$ 504A, −$V_s$ 504B can be connected to any number of different voltage sources. For example, the voltage source inputs +$V_s$ 504A, −$V_s$ 504B can be connected to voltage sources with opposite voltage signals. Alternatively, one voltage source input can be connected to ground, while the other voltage source input is connected to a positive or negative voltage source. In certain embodiments, the voltage reference $V_{ref}$ 518 and the voltage reference $V_{ref}$ 316 share a common reference. In other embodiments, the voltage reference $V_{ref}$ 316 and the voltage reference $V_{ref}$ 518 are different. The LPF 509 can function to remove, or attenuate, an AC component of the output signal $V_{out1}$ 310, while leaving a DC component thereof. The non-inverting amplifier can function to amplify the DC component according to the function expressed in Equation (4) below:

$$V_{out} = V_{in}\left(1 + \frac{R_2}{R_1}\right) \quad \text{Equation (4)}$$

As illustrated, the voltage output 508 of the op-amp 502 is fed back into −$V_{in2}$ 308B via the gain setting resistor $R_{g2}$ 520. The addition of the gain stage amplifier and $R_{g2}$ causes the signal gain at the instrumentation amplifier 302 to become as follows in Equation (5):

$$Signal_{gain} = 1 + \frac{R_{fb}}{R_g \| R_{g2}} \quad (5)$$

Further, the DC gain becomes:

$$DC_{gain} = \frac{Signal_{gain}}{1 + (Amplifier_{gain} * R_{fb}/R_{g2})} \quad (6)$$

The non-inverting amplifier gain may be calculated as shown in Equation (7) for resistors $R_1$ 516, $R_2$ 514, and with the voltage reference $V_{ref}$ 518 set to 0 V:

$$Amplifier_{gain} = 1 + \frac{R_2}{R_1} \quad (7)$$

Accordingly, the addition of the non-inverting amplifier (502, 514, 516) can further attenuate the DC offset independent of the signal gain. If the non-inverting amplifier gain is set to one, then the DC gain is limited to:

$$DC_{gain} = 1 + \frac{R_{fb} \| R_{g2}}{R_g} \quad (8)$$

In the case in which the gain setting resistor $R_g$ is very large, the DC gain is limited to one. To achieve a reasonable signal gain when the gain setting resistor $R_g$ is large, the value of the feedback resistor $R_{fb}$ can be selected to be even larger. Furthermore, when the non-inverting amplifier gain is set to one, a reasonable a ratio of signal gain to DC gain can be achieved without saturating the measurement system, even on low supply rails. Thus, the circuit 500 is capable of limiting the DC gain to at least one, while producing a large signal gain. For example, if the feedback resistor $R_{fb}$=100 k and the gain setting resistor $R_g$=$R_{g2}$=2 k, the signal gain should be approximately 101, and the DC gain should be approximately 1.98. The addition of the gain of the non-inverting amplifier can give more flexibility if attenuation of the DC component is desired.

As illustrated, the circuit 500 can further include a high pass filter 540, corresponding to the high pass filter block 216 and the high pass filter block 412 of FIGS. 2 and 4, respectively. The HPF 540 can be implemented in a variety of ways, using various components, as described previously. In certain embodiments, the HPF 540 is implemented using a capacitor $V_{filt2}$ 542 in series with the output $V_{out1}$ 310 and the output $V_{out2}$ 548. One end of the capacitor $C_{filt2}$ 542 is connected with the output $V_{out1}$ 310, and the other end of the capacitor $C_{filt2}$ 542 is connected with the output $V_{out2}$ 548, and one end of a resistor $R_{filt2}$ 544. The other end of the resistor $R_{filt2}$ 544 is connected with the voltage reference $V_{ref}$ 546. The voltage reference $V_{ref}$ 546 may be equivalent to, or different from, the voltage reference $V_{ref}$ 316 and/or the voltage reference $V_{ref}$ 518. Thus, the cutoff frequency of the HPF 540 can be described as:

$$f_c = \frac{1}{2\pi\tau} = \frac{1}{2\pi R_{filt2} * C_{filt2}} \quad (9)$$

FIG. 5B illustrates an alternate circuit, also capable of producing a high front-end gain of the AC component while maintaining a relatively low gain of the DC offset (less than approximately two). The alternate circuit illustrated in FIG. 5B can be achieved by removing the low-pass filter circuit 509 (510, 512) and the non-inverting amplifier circuit (502, 504A, 504B, 506A, 506B, 514, 516, 518) from circuit 500 of FIG. 5A, and connecting the voltage output $V_{out}$ 508 to a voltage source $V_s$ 507, such that the DC offset is attenuated by the instrumentation amplifier 302. The voltage source $V_s$ 507 can be the same voltage as the voltage source connected to the voltage source input +$V_s$ 504A, the voltage source input −$V_s$ 504B of FIG. 5A, or it can be different. Thus, comparing the circuit of FIG. 5B with FIG. 5A the low pass filter circuit 509, including the resistor $R_{filt}$ 510 and the capacitor $C_{filt}$ 512 is removed from the circuit 500 as well as the operational amplifier 502, its corresponding voltage sources (+$V_s$ 504A, −$V_s$ 504B) and inputs (506A, 506B), the resistors $R_2$ 514 and $R_1$ 516, and the voltage reference $V_{ref}$ 518. The voltage output $V_{out}$ 508 is connected to a voltage source $V_s$ 507 such that the voltage received at the negative input terminal −$V_{in2}$ 308B is approximately equal to the DC offset of the input signal resulting in the DC offset having a much smaller gain than the AC component of the signal, or being attenuated by the instrumentation amplifier 302. In this regard, the effects of the DC offset can be attenuated by adjusting the voltage source $V_s$ 507 connected to the output voltage $V_{out}$ 508. The DC offset can be determined using a voltmeter, or some other device capable of determining voltage, and a controller can adjust the voltage source based on the determined voltage by the voltmeter. Alternatively, the voltage source $V_s$ 507 can be manually adjusted.

FIG. 6 illustrates another embodiment of a circuit 600 configured to produce relatively high front-end gain of the AC component while attenuating or maintaining a relatively low gain for the DC offset. In certain embodiments, the circuit 600 can reject DC component of the signal, resulting in a gain of approximately zero. The circuit 600 includes the components of the instrumentation amplifier topology 300, with some variations, as well as the high pass filter described in greater detail in FIG. 5A. For example, in this configuration, the voltage reference $V_{ref}$ 316 is still coupled with the input $-V_{in2}$ 308B via the gain setting resistor $R_g$ 314, but is no longer coupled with the input $+V_{in2}$ 308A.

The feedback block of FIG. 6 also includes an inverting integrator 601. The inverting integrator 601 includes a resistor $R_{filt}$ 610 in series with an op-amp 602. The inverting integrator 601 further includes a capacitor $C_{filt}$ 614, which is connected to the $R_{filt}$ 610 and the negative terminal 606B on one end and is connected to the output 608 and the input $+V_{in2}$ 308A on the other end. The op-amp 602 includes voltage source inputs 604A, 604B as well as a positive terminal 606A and a negative terminal 606B. The voltage inputs, or voltage source inputs $+V_s$ 604A, $-V_s$ 604B can be connected to any number of different voltage sources. For example, the voltage source inputs $+V_s$ 604A, $-V_s$ 604B can be connected to voltage sources with opposite voltage signals. Alternatively, one voltage source input can be connected to ground, while the other voltage source input is connected to a positive or negative voltage source. As illustrated, the output $V_{out1}$ 310 is fed through the resistor $R_{filt}$ 610, which is in series with the op-amp 602, to the negative terminal 606B. The output 608 of the op-amp 602 is fed back to the negative terminal 606B via the capacitor $C_{filt}$ 614. In certain embodiments, the positive terminal 606A is connected to a reference voltage $V_{ref}$ 612. The output 608 of the op-amp 602 may be calculated using the equation below, in which $V_{out}$ corresponds to the output 608, $V_{in}$ corresponds to the output $V_{out1}$ 310, and $V_{initial}$ is the voltage at the output $V_{out1}$ 310 at time 0:

$$V_{out} \int_0^t \frac{V_{in}}{R_{filt} C_{filt}} dt + V_{initial} \quad (10)$$

The output 608 of the op-amp 602 is fed into the instrumentation amplifier 302 via the input $+V_{in2}$ 308A. The signal gain may be represented as $1+R_{fb}/R_g$, and the DC gain would be about 0.

FIG. 7A illustrates another embodiment of a circuit 700 configured to produce high front-end gain while maintaining a small DC gain, which in some embodiments may be as low or lower than one. The circuit 600 includes most of the components of the ICM instrumentation amplifier topology 300 of FIG. 3, as well as the high pass filter 540 described in greater detail in FIG. 5A. The circuit 700 differs from the instrumentation amplifier topology 300 in at least a few ways. The circuit 700 does not include the gain setting resistor $R_g$ 314. Furthermore, while the voltage reference $V_{ref}$ 316 remains directly coupled with the input $+V_{in2}$ 308A, the voltage reference $V_{ref}$ 316 is no longer coupled with the input $-V_{in2}$ 308B. In certain embodiments, the gain of the instrumentation amplifier 302 is set using the feedback resistor $R_{fb}$ 312 and the gain setting resistor $R_{g2}$ 714. The circuit 700 also includes the HPF 540, described in greater detail above, with reference to FIG. 5A.

Also similar to FIG. 4, circuit 700 includes a LPF 709, which includes resistor $R_{filt}$ 710, in parallel with a unity gain buffer, and a capacitor $C_{filt}$ 712 in parallel with the unity gain buffer and tied to the voltage reference $V_{ref}$ 713. The unity gain buffer includes an op-amp 702, which contains voltage source inputs 704A, 704B, a positive terminal 706A, a negative terminal 706B, and an output 708. Similar to voltage source inputs 504A, 504B, of FIG. 5A, the voltage source inputs 704A, 704B can be connected to voltage sources that are opposite, or one voltage source input can be connected to ground and the other voltage source input can be connected to a positive or negative voltage source. The positive terminal 706A of the op-amp 702 is coupled with the output of the LPF 709. The negative terminal 706B of the op-amp 702 is coupled with the output 708 of the op-amp 702. In this way, the op-amp 702 is configured as a unity gain buffer, wherein the output voltage 708 is substantially equal to the voltage at the positive terminal 706A. The output 708 of the op-amp 702 is fed back into the input $-V_{in2}$ 308B of the operational amplifier via the gain setting resistor $R_{g2}$ 714. In certain embodiments, the signal gain of this configuration can also be represented using equations (5) and (8), above. Thus, as the value of the gain setting resistor $R_g$ goes to infinity, the DC gain approaches 1 and the Signal Gain becomes $1+R_{fb}/R_{g2}$.

Similar to FIG. 5B above, an alternate circuit to circuit 700 of FIG. 7A also capable of producing a high front-end gain of the AC component while maintaining a relatively low gain of the DC offset (less than approximately two) is illustrated in FIG. 7B. The alternate circuit can be achieved by removing the low-pass filter circuit 709 (710, 712) and the operational amplifier circuit (702, 704A, 704B, 706A, 706B) from the circuit 700 illustrated in FIG. 7A, and connecting the voltage output $V_{out}$ 708 to a voltage source $V_s$ 707 such that the voltage at the negative input terminal $-V_{in2}$ 308B is approximately equal to the DC offset of the input signal. The voltage source $V_s$ 707 can be the same voltage as the voltage source connected to the voltage source input $+V_s$ 704A, the voltage source input $-V_s$ 704B of FIG. 7A, or it can be different. This configuration results in the DC offset having a much smaller gain than the AC component of the signal, or being attenuated by the instrumentation amplifier 302. In this regard, the effects of the DC offset can be attenuated by adjusting the voltage source $V_s$ 707 connected to the output voltage $V_{out}$ 708. The DC offset can be determined using a voltmeter, or some other device capable of determining voltage, and a controller can adjust the voltage source based on the determined voltage by the voltmeter. Alternatively, the voltage source $V_s$ 707 can be manually adjusted.

FIG. 8 illustrates another embodiment of a circuit 800 configured to produce high front-end gain while maintaining a small DC gain, which in some embodiments may be one (0 dB). The circuit 800 accomplishes the high front-end gain and attenuation of DC offset with a non-amplified feedback. As illustrated, the circuit includes the ICM instrumentation amplifier topology 300 with some variations, as well as the HPF circuit 540, described in greater detail with reference to FIG. 5A.

The second positive terminal 308A ($+V_{in2}$) is coupled with the voltage reference the voltage reference $V_{ref}$ 316, while the input $-V_{in2}$ 308B is coupled to the voltage reference $V_{ref}$ 8 804 via a capacitor $C_{filt}$ 804, in series with the voltage reference $V_{ref}$ 8804, and the gain setting resistor $R_g$ 314. As mentioned earlier, the voltage reference $V_{ref}$ 8804 may be equivalent to, or different from the voltage reference $V_{ref}$ 316. The output $V_{out1}$ 310 is fed back to the input $-V_{in2}$ 308B via the feedback resistor $R_{fb}$ 312. The gain setting resistor $R_{g2}$ 314 and the capacitor $C_{filt}$ 802 are in parallel with the input $-V_{in2}$ 308B. At high frequencies, the capacitor $C_{filt}$ 802 acts as a short, which produces a signal gain of $1+R_{fb}/R_g$. At low/DC frequencies the capacitor $C_{filt}$ 802 acts as an open circuit. Thus, there will appear to be infinity impedance at the gain setting resistor $R_g$ 314, causing the DC gain to go to 1. Furthermore, in certain embodiments, this configuration further has a pole at $1/2 * \pi * R_g * C_{filt}$ and a zero at $1/2 * \pi * R_{fb} * C_{filt}$.

FIG. 9 is a circuit diagram illustrating one embodiment of an instrumentation amplifier configured as a HPF with switching circuitry. The circuit 900 includes the components of circuit 500, described above, as well as switching circuit components. In certain embodiments, the switching circuit components include comparators 902, 904, an OR gate 906, a clock 908 and counter 910. Although described in terms of comparator, counters and OR gates, other values or logical equivalents may be used to implement the switching circuit without departing from the spirit and scope of the description. The switching circuit produces control signals S1 912 and S2 914, which are used to control switches 920 and 922, respectively. The switching circuitry further includes resistors 916 and 918, used in conjunction with switches 916 and 918, respectively. Other switching circuit topologies may be used without departing from the spirit and scope of the description. For example, the switching circuitry may include Furthermore, although illustrated in FIG. 9, it is to be understood that the switching circuitry may be implemented with any one of the various embodiments described above with reference to FIGS. 5-8. Furthermore, the switching circuitry may be used with other embodiments without departing from the spirit and scope of the description.

In the event of fast input transients, the comparators 902, 904 detect when the output signal $V_{out1}$ 310 "rails," or when the instrumentation amplifier 302 saturates. For example, the output signal $V_{out1}$ 310 may rail when the capacitor $C_{filt}$ 512 of the LPF is charging and discharging. The comparators trigger a counter that outputs control signals 912, 914. The control signals 912, 914 are used to close switches 920, 922, respectively. Once closed, the switches 920, 922 allow the resistors Rs1 916, Rs2 918 to form part of the closed circuit. In certain embodiments, the values of the resistors Rs1 916 and Rs2 918 are significantly less than the values of the resistors $R_{filt}$ 510 and $R_{filt2}$ 544, which allows the capacitor $C_{filt}$ 512 and the capacitor $C_{filt2}$ 542 to charge more quickly, leading to improved settling times.

Simulated Examples

Figure 10:
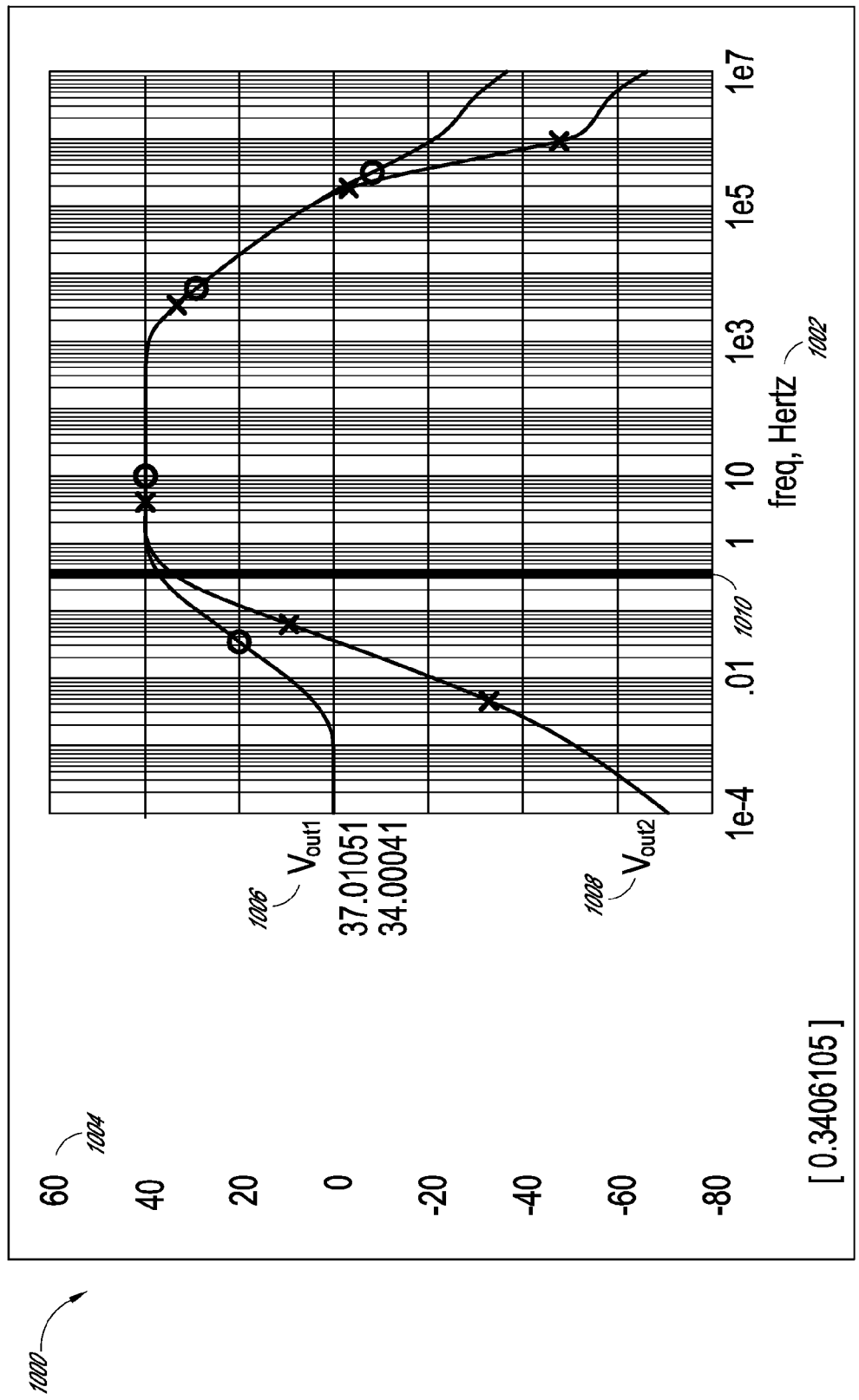
FIG. 10 is a graph showing the gain achieved with an instrumentation amplifier circuit according to one embodiment.
Figure 11:
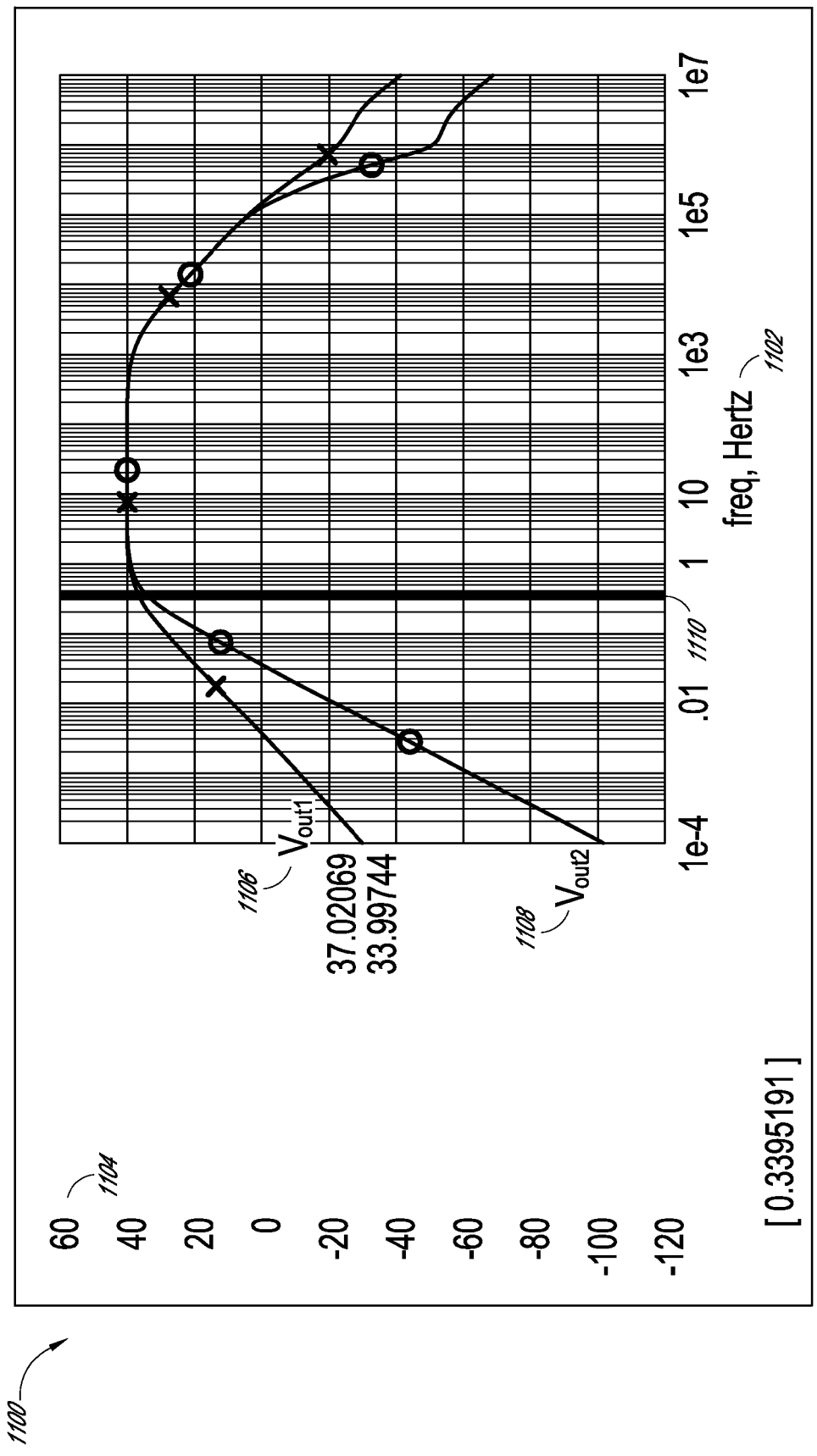
FIG. 11 is a graph showing the gain achieved with an instrumentation amplifier circuit according to another embodiment.

FIGS. 10 and 11 are graphical illustrations of embodiments of the gain achieved using the topologies discussed above. FIG. 10 relates to the embodiments illustrated in FIGS. 5, 7 and 8. FIG. 11 relates to the embodiment illustrated in FIG. 6.

FIG. 10 is a graphical illustration of an embodiment of the gain achieved with an instrumentation amplifier configured as a high-pass filter, similar to the embodiments described above with reference to FIG. 5A. The graph 1000 includes an x-axis 1002 of frequency in a logarithmic scale. The y-axis represents decibel (dB) levels of a signal. Graph 1000 further includes a first line 1006, corresponding to the output $V_{out1}$ 310 and a second line 1008, corresponding to the output $V_{out2}$ 548. In one non-limiting embodiment, the line 1006 may be achieved by setting the value of the feedback resistor $R_{fb}$=264 kΩ, $R_{g2}$=8 kΩ, $R_g$=4 kΩ, the second amplifier gain=3 (R2=16 kΩ, R1=8 kΩ), $C_{filt}$=$C_{filt2}$=4.7 µF, $R_{filt}$=10 MΩ, $R_{filt2}$=100 kΩ. Other applicable values will be readily determined by one of ordinary skill in the art. Furthermore, different, fewer, or more components may be used without departing from the spirit and scope of the description. As illustrated, the output $V_{out1}$ achieves a signal gain of 40 dB, or 100, and a DC gain of one (0 dB). The addition of the HPF further improves the circuit function by removing the DC offset. Similar results can be achieved using the other topologies, configurations, and embodiments discussed above, with reference to FIGS. 7, 8, and 9, using similar resistor and capacitor values. For example, results similar to those shown in Graph 1000 can be achieved using the embodiment illustrated in FIG. 7A and the same resistor and capacitor levels except for changing the value of the feedback resistor $R_{fb}$ to 247.5 kΩ and the value of the gain setting resistor $R_{g2}$ to 2.5 kΩ. Similarly, the embodiment illustrated in FIG. 8 can be used to produce similar results, while changing the feedback resistor $R_{fb}$ to 10 MΩ, and the gain setting resistor $R_{g2}$ to 100 kΩ. However, it is to be understood that other resistor and capacitor values may be used without departing from the spirit and scope of the description.

FIG. 11 is a graph of an embodiment of the gain achieved with an instrumentation amplifier configured as a high-pass filter, similar to the configuration described above with reference to FIG. 6. The graph 1100 includes an x-axis 1102 in frequency in a logarithmic scale. The y-axis represents decibel (dB) levels of a signal. Graph 1100 further includes a first line 1106, corresponding to the output $V_{out1}$ 310 and a second line 1108, corresponding to the output $V_{out2}$ 548. As illustrated, the output $V_{out1}$ achieves a signal gain of 100 while attenuating the DC offset. The addition of the HPF further improves the circuit response. Similar values for the resistors and capacitors described above with reference to FIG. 10 may be used, however, the resistors $R_{fb}$ and $R_g$ may be changed to 247.5 kΩ and 2.5 kΩ, respectively.

Applications

The embodiments described above can be used for high front-end gain in the presence of a large DC offset in health monitors. However, the principles and advantages of the embodiments can apply to any similar systems or devices where a relatively small signal is present in a system with a large DC offset.

Thus, a skilled artisan will appreciate that the configurations and principles of the embodiments can be adapted for any other electronic system. The circuits employing the above described configurations can be implemented into various electronic devices or integrated circuits. Examples of the electronic devices can include, but are not limited to, consumer electronic products, parts of the consumer electronic products, electronic test equipments, healthcare monitors, etc. Further, the electronic device can include unfinished products. Furthermore, the various topologies, configurations and embodiments described above may be implemented discretely or integrated on a chip without departing from the spirit and scope of the description.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. An apparatus comprising:
an instrumentation amplifier circuit comprising:
    an instrumentation amplifier;
    a plurality of first input nodes;
    a first output node;
    a feedback resistor electrically coupled between the first output node and at least one of the plurality of first input nodes; and
    a first gain setting resistor electrically coupled between at least one of the plurality of first input nodes and at least one other node, wherein a gain of the instrumentation amplifier is determined at least by a value of the gain setting resistor; and
a feedback circuit comprising:
at least one operational amplifier;
at least one input electrically coupled to the first output node; and
a second output node directly or indirectly coupled to at least one of the plurality of first input nodes.

2. The apparatus of claim 1, wherein the feedback circuit further comprises:
an operational amplifier circuit comprising:
the operational amplifier; and
a plurality of second input nodes, wherein the second output node is electrically coupled to at least one of the plurality of second input nodes; and
a low pass filter circuit electrically coupled with the at least one input of the feedback circuit and at least one of the plurality of second input nodes.

3. The apparatus of claim 2, wherein the low pass filter circuit comprises at least one resistor and one capacitor.

4. The apparatus of claim 2, further comprising:
a second gain setting resistor electrically coupled between the second output node and at least one of the plurality of first input nodes;
wherein the operational amplifier circuit further comprises:
a first resistor electrically coupled between a selected one of the plurality of second input nodes and a voltage reference; and
a second resistor electrically coupled between the second output node and the selected one of the plurality of second input nodes;
wherein the second output node is electrically coupled to the at least one of the plurality first input nodes via a second gain setting resistor.

5. The apparatus of claim 1, wherein:
the second output node is electrically coupled directly to at least one of the plurality of second input nodes; and the first gain setting resistor is electrically coupled between the second output node and the at least one of the plurality of first input nodes.

6. The apparatus of claim 1, wherein the feedback circuit further comprises:
an integrator circuit comprising:
the operational amplifier, wherein the operational amplifier is in an inverting configuration;
a plurality of second input nodes;
a resistor disposed in a signal path between the at least one input of the feedback circuit and at least one of the second input nodes; and
a capacitor electrically coupled between the second output node and the at least one of the second input nodes, wherein the second output node is electrically coupled to a non-inverting input of the plurality of first input nodes.

7. The apparatus of claim 6, wherein a DC component of the signal has a gain of approximately zero and an AC component has a gain of at least one.

8. The apparatus of claim 1, wherein at least one of the plurality of first input nodes is electrically coupled to an electrode and receive a signal indicative of a physiological parameter.

9. The apparatus of claim 8, wherein a DC component of the signal has a gain of less than approximately two and an AC component has a gain of greater than approximately one.

10. The apparatus of claim 1, wherein the DC component of the signal has a gain of less than approximately two and an AC component has a gain of greater than approximately twenty.

11. The apparatus of claim 1, further comprising a high pass filter circuit electrically coupled to the first output node.

12. The apparatus of claim 11, wherein the high pass filter comprises at least a resistor and a capacitor.

13. The apparatus of claim 1, further comprising a switching circuit configured to determine when the instrumentation amplifier circuit has saturated, and at least partly in response to the determination, to activate at least one switch, the at least one switch configured to reduce a time constant of an associated filter to reduce a recovery time of an output signal of the instrumentation amplifier circuit from that of a saturated state.

14. A health monitor comprising:
at least one of an electrode and a sensor configured to receive a signal indicative of a physiological parameter and including an AC component and a DC offset significantly larger than the AC component; and
an amplifier circuit configured to receive the signal from the at least one of an electrode and a sensor and further configured to amplify the AC component at a higher gain than the DC offset, wherein the amplifier circuit comprises
an instrumentation amplifier block comprising:
an instrumentation amplifier;
a plurality of first input nodes;
a first output node;
a feedback resistor electrically coupled between the first output node and at least one of the plurality of first input nodes;
a first gain setting resistor electrically coupled between at least one of the plurality of first input nodes and at least one other node, wherein a gain of the instrumentation amplifier is determined by a value of the gain setting resistor; and
a feedback block comprising:
at least one operational amplifier;
at least one input electrically coupled to the first output node; and
a second output node directly or indirectly coupled to at least one of the plurality of first input nodes.

15. The health monitor of claim 14, further comprising
an analog-to-digital converter configured to receive the amplified signal from the amplifier circuit and convert the signal to a digital signal; and
a digital signal processor configured to process the digital signal.

16. The health monitor of claim 14, wherein the gain of the DC offset of the signal is approximately one or less than one.

17. The apparatus of claim 1, wherein the plurality of first input nodes are coupled to the instrumentation amplifier and comprise a plurality of inverting input nodes and a plurality of non-inverting input nodes.

18. The apparatus of claims 17, wherein the instrumentation amplifier circuit further comprises a plurality of voltage source inputs coupled to the instrumentation amplifier.

19. The apparatus of claim 14, wherein the plurality of first input nodes are coupled to the instrumentation amplifier and comprise a plurality of inverting input nodes and a plurality of non-inverting input nodes.

20. The apparatus of claims 19, wherein the instrumentation amplifier circuit further comprises a plurality of voltage source inputs coupled to the instrumentation amplifier.

* * * * *

UNITED STATES PATENT AND TRADEMARK OFFICE
CERTIFICATE OF CORRECTION

PATENT NO. : 8,390,374 B2
APPLICATION NO. : 13/013666
DATED : March 5, 2013
INVENTOR(S) : Alexander et al.

Page 1 of 1

It is certified that error appears in the above-identified patent and that said Letters Patent is hereby corrected as shown below:

Title page, item 56, column 2 at line 12, Under Other Publications, Change "amplifer" to --amplifier--.

In the Specifications
In column 7 at line 38, Change "Vout 310." to --$V_{out}$ 310.--.
In column 10 at line 19, Change "$V_{filt2}$ 542" to --$C_{filt2}$ 542--.
In column 11 at line 35, Change "$V_{out} \int_0^t \frac{V_{in}}{R_{filt} C_{filt}} dt + V_{initial}$" to --$V_{out} = \int_0^t \frac{V_{in}}{R_{filt} C_{filt}} dt + V_{initial}$--.
In column 12 at lines 47-48, Change "$V_{ref}8$ 804" to --$V_{ref}804$--.
In column 12 at line 48, Change "$C_{filt}$ 804," to --$C_{filt}$ 802,--.
In column 12 at line 49, Change "$V_{ref}8804$," to --$V_{ref}$ 804,--.
In column 12 at line 50, Change "$V_{ref}8$ 804" to --$V_{ref}$ 804--.

In the Claims
In column 16 at line 33, In Claim 18, Change "claims" to --claim--.
In column 16 at line 60, In Claim 20, Change "claims" to --claim--.

Signed and Sealed this
Twenty-fifth Day of March, 2014

Michelle K. Lee
*Deputy Director of the United States Patent and Trademark Office*